(12) United States Patent
Knecht et al.

(10) Patent No.: US 7,158,767 B2
(45) Date of Patent: Jan. 2, 2007

(54) TUNEABLE FREQUENCY TRANSLATOR

(75) Inventors: Thomas A. Knecht, West Dundee, IL (US); Stephane Michel, Schaumburg, IL (US); Glen O. Reeser, Palatine, IL (US)

(73) Assignee: CTS Corporation, Elkhart, IN (US)

( * ) Notice: Subject to any disclaimer, the term of this patent is extended or adjusted under 35 U.S.C. 154(b) by 337 days.

(21) Appl. No.: 10/693,251

(22) Filed: Oct. 24, 2003

(65) Prior Publication Data
US 2005/0090222 A1    Apr. 28, 2005

(51) Int. Cl.
H04B 1/06 (2006.01)
H04B 7/00 (2006.01)
H04B 1/40 (2006.01)

(52) U.S. Cl. .................. 455/130; 455/76; 455/264; 331/16; 331/108 D; 331/117 R (58) Field of Classification Search ........... 455/75–77, 455/182.3, 184.1, 180.3, 180.4, 255–265, 455/333, 339–340, 87, 323; 331/16–17, 331/25, 107, 177 R, 96, 108 D, 179, 175, 331/117 R
See application file for complete search history.

(56) References Cited

U.S. PATENT DOCUMENTS

| | | | |
|---|---|---|---|
| 4,321,706 A | 3/1982 | Craft | |
| 5,331,293 A | 7/1994 | Shepherd et al. | |
| 5,373,262 A * | 12/1994 | Yamamoto et al. | 331/96 |
| 5,381,117 A * | 1/1995 | Okamura et al. | 333/175 |
| 5,764,697 A | 6/1998 | Sakuma et al. | |
| 5,794,131 A | 8/1998 | Cairns | |
| 5,821,818 A | 10/1998 | Idei et al. | |
| 5,872,489 A | 2/1999 | Chang et al. | |
| 5,982,244 A | 11/1999 | Fujisaki | |
| 5,983,077 A | 11/1999 | Dent | |
| 6,005,466 A | 12/1999 | Peder | |
| 6,072,992 A | 6/2000 | Mishima et al. | |
| 6,081,164 A * | 6/2000 | Shigemori et al. | 331/16 |
| 6,140,884 A * | 10/2000 | Harpham et al. | 331/117 R |
| 6,239,664 B1 | 5/2001 | Northam | |
| 6,268,778 B1 * | 7/2001 | Mucke et al. | 331/117 R |
| 6,370,365 B1 | 4/2002 | Callaway, Jr. et al. | |
| 6,388,535 B1 | 5/2002 | Otsuki et al. | |
| 6,433,645 B1 | 8/2002 | Mann et al. | |
| 6,469,553 B1 | 10/2002 | Sung et al. | |
| 6,603,367 B1 * | 8/2003 | Pao et al. | 331/177 V |
| 6,661,295 B1 | 12/2003 | Knecht et al. | |

(Continued)

FOREIGN PATENT DOCUMENTS

DE    199 52 192    4/2001

(Continued)

OTHER PUBLICATIONS

Brochure entitled "Optimizing VCO/PLL Evaluations & PLL Synthesizer Designs," from Mini-Circuits, undated.

(Continued)

Primary Examiner—Simon Nguyen
(74) Attorney, Agent, or Firm—Edward L. Bishop; Steven Weseman; Daniel J. Deneufbourg (57) ABSTRACT

A tuneable frequency translator is disclosed having electrical circuitry mounted to a circuit board. The circuitry is designed to provide a phase-locked loop with a resonator. Compliant material is positioned between the resonator and the circuit board. Operably coupled to the resonator is at least one passive device that is short-circuited by an electrically conductive lead. The resonant frequency of the frequency translator can be changed by severing the electrically conductive lead, and thus activating the associated passive device.

34 Claims, 7 Drawing Sheets

U.S. PATENT DOCUMENTS

| | | | |
|---|---|---|---|
| 6,670,861 B1 * | 12/2003 | Balboni | 332/103 |
| 6,825,734 B1 * | 11/2004 | Clark | 331/96 |
| 6,944,432 B1 * | 9/2005 | Pohjonen | 455/260 |
| 2003/0062541 A1 | 4/2003 | Warner | |
| 2003/0193373 A1 | 10/2003 | McCarthy et al. | |
| 2004/0232995 A1 * | 11/2004 | Thomsen et al. | 331/2 |
| 2005/0242897 A1 * | 11/2005 | Lim et al. | 331/179 |

FOREIGN PATENT DOCUMENTS

| | | |
|---|---|---|
| EP | 0 409 127 A2 | 1/1991 |
| EP | 1 069 576 | 1/2001 |
| JP | 61077415 | 4/1986 |
| JP | 01025402 | 7/1987 |
| JP | 04094505 | 8/1990 |

OTHER PUBLICATIONS

U.S. Appl. No. 09/974,791, filed Apr. 2002, Shintani et al.

* cited by examiner

TUNEABLE FREQUENCY TRANSLATOR

TECHNICAL FIELD

This invention relates to frequency translator circuits, and in particular, to frequency translator circuits that can be tuned or calibrated after fabrication onto a circuit board.

BACKGROUND

High capacity data networks rely on signal repeaters and sensitive receivers for low-error data transmission. To decode and/or cleanly retransmit a serial data signal, such network components include sub-components for creating a data timing signal having the same phase and frequency as the data signal. This step of creating a timing signal is known as "clock recovery."

Data clock recovery requires a relatively high purity reference signal to serve as a starting point for matching the serial data signal clock rate and also circuitry for frequency adjustment. The type, cost and quality of the technology employed to generate the high purity reference signal varies according to the class of data network application. Typically, for remote or moveable systems, components including specially configured resonators have been used. As communication network technology progresses towards providing higher bandwidth interconnections to local area networks and computer workstations, the need has grown for smaller and cheaper clock recovery technology solutions.

For many higher frequency applications now in demand, resonator technologies such as surface-acoustic wave (SAW) resonators are sometimes used. These resonators are used in frequency translators for generating an output clock signal that is related to an input clock signal. Typically, the output clock signal is a fixed multiplied representation of the input clock signal. Moreover, the frequency translator maintains the output clock signal at a fixed phase relationship to the input or reference clock signal. Applications for frequency translators include, but are not limited to, providing a clock signal for synchronizing cellular telephone basestations to telecommunication network backbones.

The fabrication process used in producing frequency translators typically involves complex steps. Moreover, the steps in the fabrication process must be changed based on different requirements and operating parameters such as input and output clock signals. As a result of both the complex steps and different operating requirements, producing frequency translators with an adequate yield can be difficult.

One approach for improving yield is to produce a frequency translator that allows the user to choose the desired operating input and output clock signals of the translator. The user accomplishes this task by selecting from a plurality of configuration inputs connected to a microprocessor that controls the operation of the translator. However, using a microprocessor with the design of a frequency translator adds cost and increases the size of the device.

In addition to changing the general input and output characteristics of the frequency translator, an approach taken to optimizing the nominal frequency of the device is to frequency adjust the SAW resonator itself. However, this can be a difficult and costly task.

SAW based frequency translators are often sensitive to vibrations, a condition which has been labeled "microphonics." Microphonics is a condition where the output frequency of the SAW resonator is modulated in an unwanted manner due to vibrations. Sources of external vibration can range from fans for cooling electronic circuitry, to road vibration caused by vehicle movement remote from the frequency translator.

Hence, there remains a need for a frequency translator design that is more cost efficient and vibration resistant.

SUMMARY

A tuneable frequency translator is disclosed having electrical circuitry mounted to a circuit board. The circuitry is designed to provide a phase-locked loop with a resonator. Compliant material is positioned between the resonator and the circuit board. Operably coupled to the resonator is at least one passive device that is short-circuited by an electrically conductive lead. The resonant frequency of the frequency translator can be changed by severing the electrically conductive lead, and thus activating the associated passive device. The tuneable frequency translator can also include a nonvolatile memory that contains data for configuring prescalers and other operational aspects related to a desired clock input and output combination.

A method is also disclosed for fabricating a frequency translator circuit having a resonator coupled to at least one passive device and an electrically conductive lead short-circuiting at least a portion of the passive device. The method includes attaching the resonator to a circuit board with compliant material positioned between the resonator and the circuit board. Next, a reference frequency is provided to the frequency translator circuit and the output frequency generated by the frequency translator circuit is observed. Subsequently, the electrically conductive lead is severed and the output frequency of the frequency translator is observed again.

There are other advantages and features that will be more readily apparent from the following detailed description of the preferred embodiment of the invention, the drawings, and the appended claims.

BRIEF DESCRIPTION OF THE DRAWINGS

In the accompanying drawings that form part of the specification, and in which like numerals are employed to designate like parts throughout the same.

DETAILED DESCRIPTION

While this invention is susceptible to embodiments in many different forms, this specification and the accompanying drawings disclose only preferred forms as examples of the invention. The invention is not intended to be limited to the embodiments so described, however. The scope of the invention is identified in the appended claims.

In the FIGURES, a single block or cell may indicate several individual components and/or circuits that collectively perform a single function. Likewise, a single line may represent several individual signals or energy transmission paths for performing a particular operation.

Figure 1:
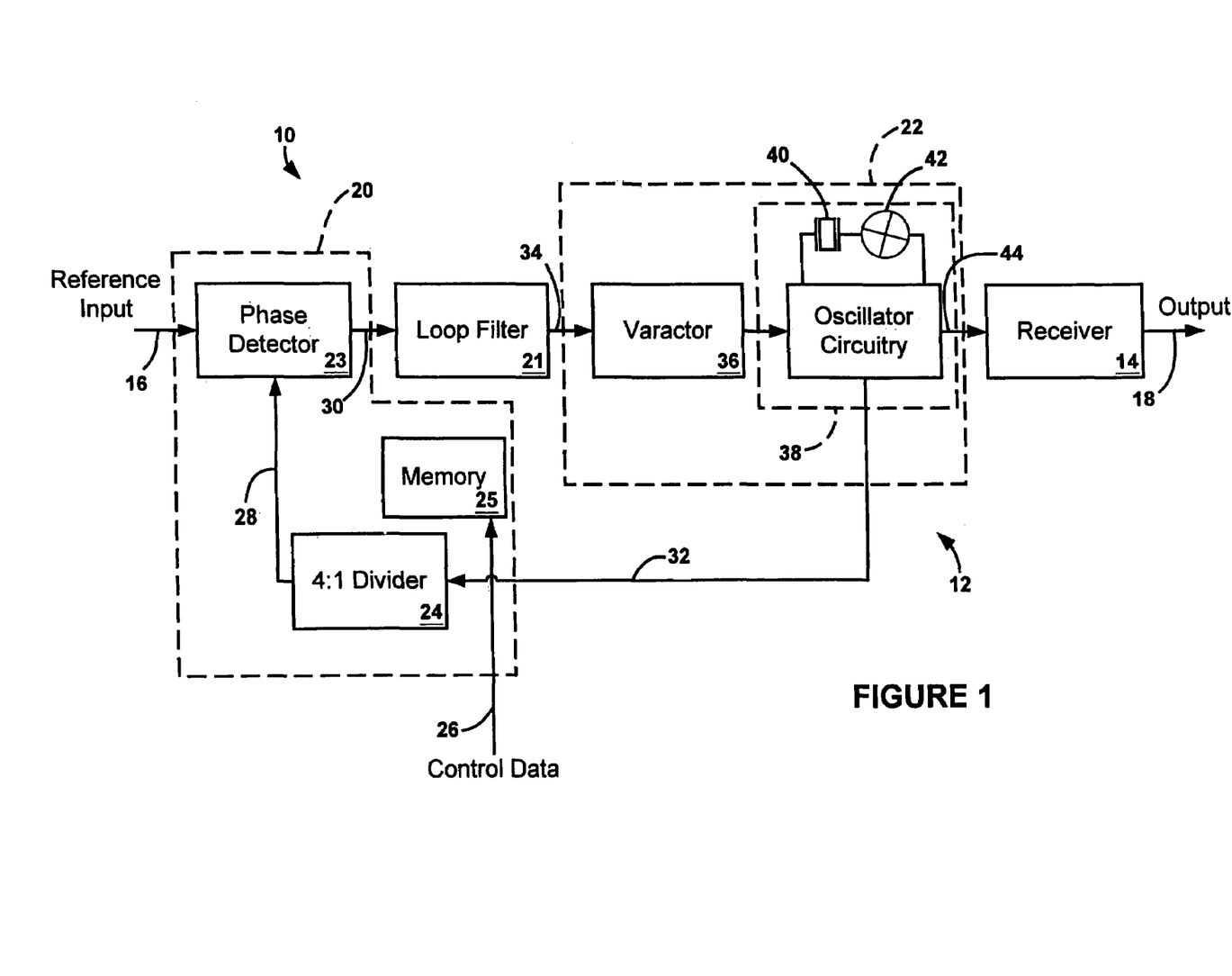
FIG. 1 is a block diagram of a frequency translator according to an embodiment of the invention.

Turning to FIG. 1, a tuneable frequency translator is depicted in block diagram form. The frequency translator 10 includes a phase-locked loop 12 and a receiver 14 for providing an output signal 18 that is a multiplied representation of the input signal 16.

Preferably, the frequency translator 10 receives a 155.52 MHZ reference frequency signal at input 16 and, in response to the reference signal, generates an output frequency 18 that is about four times the reference signal (i.e., the output is about 622.08 MHZ). However, it is to be understood that the frequency translator design disclosed herein is also capable of receiving different reference frequency inputs and generating different output frequencies that are various multiples of the input.

Within the frequency translator 10, the phase-locked loop 12 provides for maintaining the output frequency signal 18 at a specific phase relationship to the input reference signal 16. Preferably, the phase-locked loop 12 includes a frequency synthesizer 20, a loop filter 21, and a voltage controlled oscillator 22.

The frequency synthesizer 20 provides for frequency synthesis in response to the input reference signal 16 and a voltage controlled oscillator feedback signal 32. Preferably, the frequency synthesizer 20 is an integrated circuit that includes a phase detector 23, a divider 24, and a nonvolatile memory 25.

The nonvolatile memory 25 can include a read-only memory, a programable read-only memory, an electrically erasable programable read-only memory, or other type of nonvolatile memory. As explained in detail further herein, the nonvolatile memory 25 stores control data 26 that is provided for configuring the frequency synthesizer 20, and thus the phase-locked loop 12.

The phase detector 23 produces an output 30 that corresponds to the phase difference between two input signals 28 and 16. In particular, the phase detector 23 receives the reference frequency input signal 16 and a divided feedback signal 28 provided by the divider 24. In response to these two signals, the phase detector 23 generates an output signal 30 that, as indicated previously, corresponds to the phase difference between the reference frequency input 16 and a divided feedback signal 28.

Preferably, the output 30 of the phase detector 23 is a charge pump that sources and sinks current in proportion to the phase difference between the reference frequency input 16 and the feedback signal 28. However, instead of a charge pump, the output 30 can be an analog or digital signal for representing the phase difference between the reference frequency input 16 and the divided feedback 28.

The divider 24 within the frequency synthesizer 20 is a circuit that generates a divided feedback signal 28 in response to a feedback signal 32 provided by the voltage controlled oscillator 22. Preferably, the divided feedback signal 28 has a frequency that is an integer division of the frequency of the feedback signal 32 provided by the voltage controlled oscillator 22. Preferably, the divider 24 has a divider ratio of 4 to 1.

The output 30 of the phase detector 23, and thus the frequency synthesizer 20, is received by the loop filter 21 to produce an oscillator control signal 34. The loop filter 21 shapes the overall response of the phase-locked loop 12 and preferably provides a bandwidth of about 100 Hz or less.

The oscillator control signal 34 generated by the loop filter 21 is received by the voltage controlled oscillator 22. In response to the oscillator control signal 34, the voltage controlled oscillator 22 generates a phase-locked loop output signal 44 and feedback signal 32. In an embodiment, the phase-locked loop output signal 44 and the feedback signal 32 can be the same signal.

The voltage controlled oscillator 22 includes a varactor 36 and a tuneable oscillator circuit 38 that are responsive to the oscillator control signal 34. In particular, the varactor operates as what is commonly known as a principle variable or tuning element. Although the varactor 36 is commonly known as a tuning element, the varactor should not be confused with the impedance network or tuner 42 described in detail further herein. Accordingly, as used herein and in the claims, the terms "tuner" or "tuner circuit" do not refer to varactor 16.

In response to the oscillator control signal 34 and the state of the varactor 36, the tuneable oscillator 38 produces the phase-locked loop output signal 44. Preferably, the phase-locked output signal 44 has a frequency of about 622.08 MHZ.

The tuneable oscillator circuit 38 includes a resonator 40, an impedance network or tuner 42, and other circuitry. The resonator 40 operates as the primary frequency regulator within the tuneable oscillator 38. Preferably, the resonator 40 is a one-port surface-acoustic wave resonator and is coupled to the impedance network 42.

Figure 8:
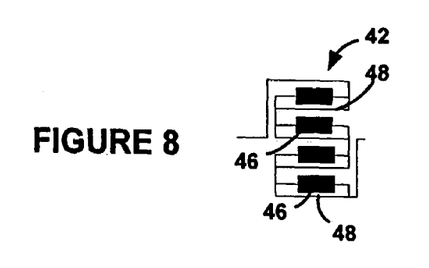
FIG. 8 is a schematic diagram of an impedance network and the passive devices contained for adjusting the resonant frequency output of the frequency translator.

As explained in detail further herein, the impedance network 42 can be selectively manipulated to adjust the output of the oscillator 38, and thus the phase-locked loop 12. In particular, and as shown in FIG. 8, the impedance network 42 can include one or more (i.e., plurality) passive devices 46 such as inductors, capacitors, or resistors that are coupled together and can be selectively activated.

The output 44 of the phase-locked loop 12 is provided to the receiver 14 wherein the waveform is modified to provide the output 18 of the frequency translator 10. In particular, the receiver 14 generates a square-wave logic level output, at the frequency translator output 18, that corresponds and is in response to the phase-locked loop output signal 44.

A tuneable frequency translator was fabricated according to an embodiment of the present invention. A simplified circuit of the fabricated sample is presented in FIG. 2.

Figure 2:
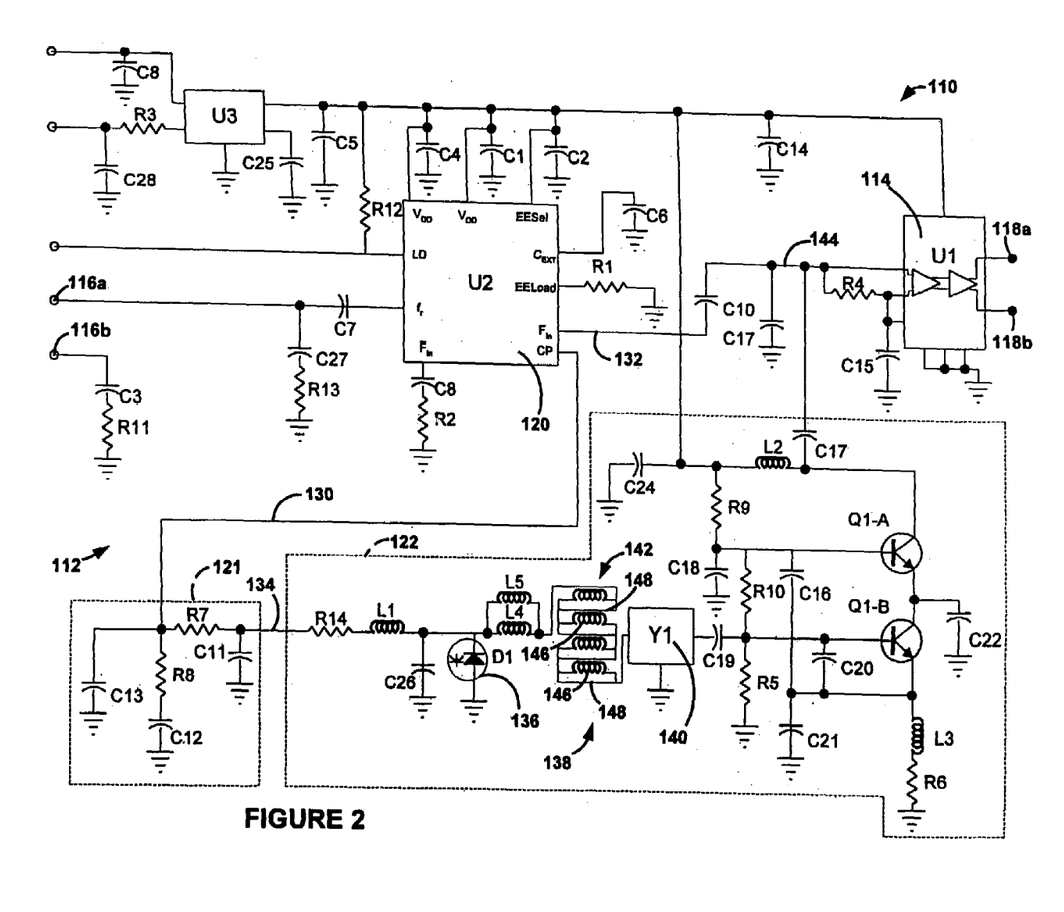
FIG. 2 is a simplified circuit diagram of a frequency translator according to a preferred embodiment of the invention.

Like the tuneable frequency translator 10 of FIG. 1, the tuneable frequency translator 110 of FIG. 2 includes a phase-locked loop 112 and a receiver 114 wherein the frequency translator 110 generates an output frequency that is a multiplied representation of the input reference frequency.

Preferably, the frequency translator 110 receives a 155.52 MHZ differential reference frequency input signal at 116a and 116b. In response to the input signal, the frequency translator 110 generates a 622.08 MHZ differential output frequency at 118a and 118b.

The phase-locked loop 112 preferably includes a frequency synthesizer 120, a loop filter circuit 121, and a voltage controlled oscillator circuit 122. Preferably, the frequency synthesizer 120 is a single integrated circuit with other support circuitry connected thereto. In an embodiment, the frequency synthesizer 120 is manufactured and sold by Peregrine Semiconductor Corporation under the part number PE3341. It is to be understood, however, that other integrated circuits or discrete components can be used for the frequency synthesizer other than those shown in FIG. 2.

Figure 3:
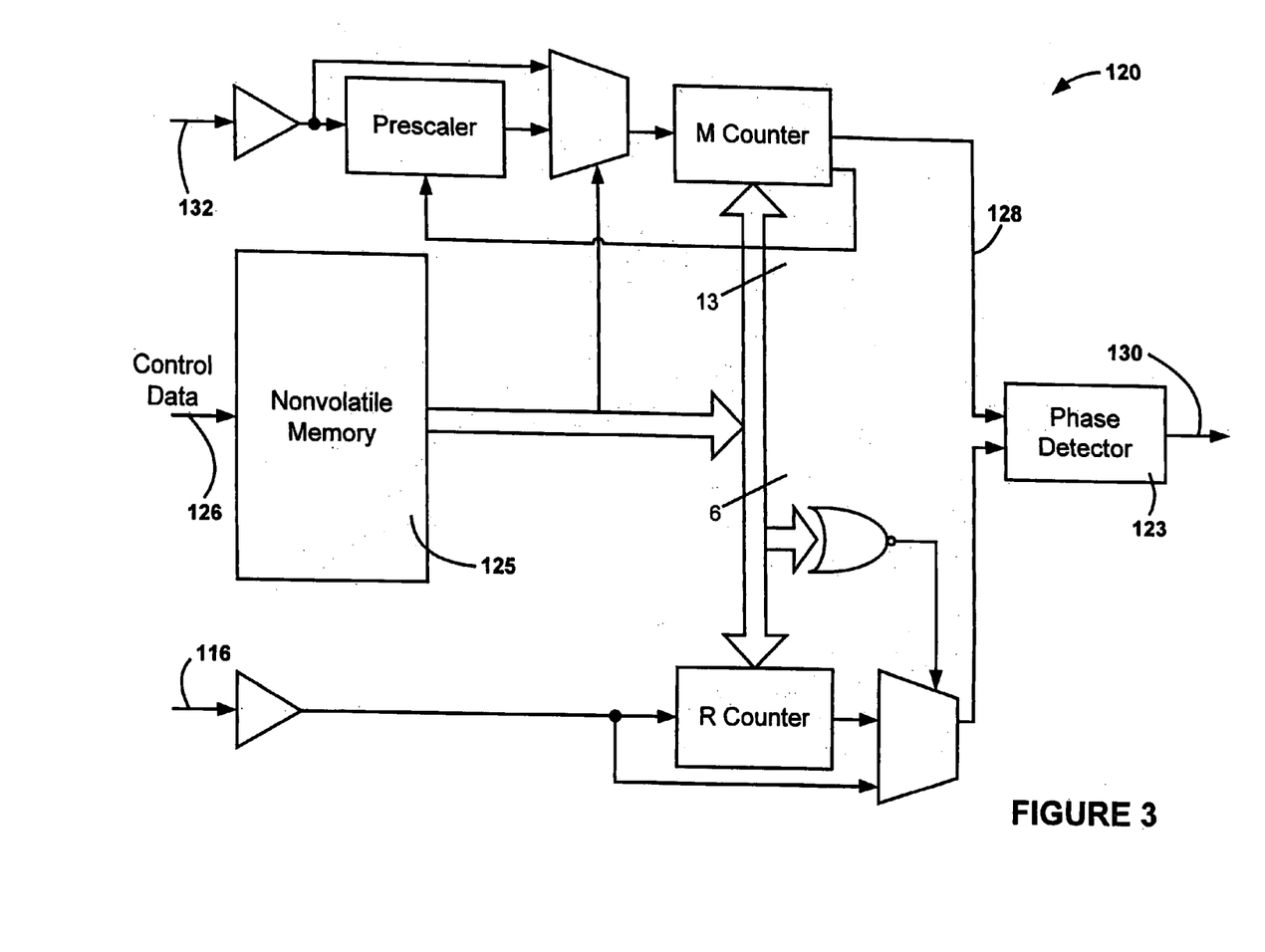
FIG. 3 is a simplified block diagram of a frequency synthesizer depicted within the circuit diagram of FIG. 2.

Turning to FIG. 3, a simplified block diagram is provided of the frequency synthesizer 120 which includes a phase detector 123, a divider, and a nonvolatile memory 125 comprising an electrically erasable programable read-only memory. Preferably, control data 126 is stored into the nonvolatile memory 125 and provides for configuring the frequency synthesizer 120. In particular, the frequency synthesizer 120 can include a dual-modulus prescaler along with counters that are configured by the control data 126 stored within the nonvolatile memory 125. As a result, the frequency translator 110 (FIG. 2) can be configured to operate using various clock inputs for generating a desired output as specified by the control data 126.

The prescaler and the counters enable a large division ratio to be realized by the frequency synthesizer 120. For instance, the synthesizer 120 can include a dual modulus prescaler that divides the frequency of the voltage controlled oscillator feedback signal 132 by an integer value that depends on the state of internal modulus select logic configured by the control data 126. Moreover, counters can divide the reference input 116 and the prescaler output by integer values stored within the memory 125 of the frequency synthesizer 120.

Turning back to FIG. 2, it is preferred that the control data 126 be loaded into the nonvolatile memory prior to installation of the synthesizer 120 within the translator circuit 110. This provides for pre-programming of the synthesizer 120 while alleviating the need to include data and control inputs within the translator circuit 110 for programming the synthesizer after the translator has been fabricated.

As stated previously, the frequency synthesizer 120 includes a phase detector and a divider. The phase detector controls the charge pump output 130 of the synthesizer 120. In particular, the frequency synthesizer scales or divides the reference input 116a and the voltage controlled oscillator feedback 132. In response to the scaled input and feedback, the phase detector commands the charge pump output 130 to source current or sink current, depending on the phase difference.

The charge pump output 130 of the frequency synthesizer 120 is received by the loop filter circuit 121. As stated previously, the loop filter 121 shapes the overall response of the phase-locked loop 112 to provide a preferred bandwidth of about 100 Hz or less. Within FIG. 2, the loop filter 121 is comprised of a network of capacitors and resistors. However, it is to be understood that other components can be used in various arrangements.

The loop filter 121 provides an output comprising an oscillator control signal 134 that is received by the voltage controlled oscillator 122. In response to the oscillator control signal 134, the voltage controlled oscillator 122 generates a phase-locked loop output 144 and a feedback signal 132.

The voltage controlled oscillator 122 includes a varactor 136 and a tuneable oscillator circuit 138 having a resonator 140 and an impedance network 142 operably connected together. The varactor 136 and the tuneable oscillator circuit 138 are responsive to the oscillator control signal 134 in generating the phase-locked loop output 144.

Within the tuneable oscillator circuit 138, the impedance network 142 has a plurality of passive elements or devices 146 and a separate electrically conductive bypass link or lead 148 that is associated with each passive device. Preferably, the passive devices 146 within the impedance network 142 include inductors 146 that are serially connected to each other with a conductive bypass lead 148 extending across the ends or terminals of each inductor. As used herein, however, the term "passive device" includes inductors, capacitors, and resistors. Moreover, the passive devices can be discrete components or, as described in detail further herein, a fabricated portion of the printed wiring on a circuit board.

The bypass leads 148 are fabricated from a conductive metal or metal alloy. Accordingly, each bypass lead 148 short circuits its associated inductor 146 so that electrical current bypasses the inductor. Stated another way, each bypass lead 148 provides a current path around its associated inductor.

Although each bypass lead 148 as shown provides a current path around its associated passive device, in an alternative embodiment, one or more bypass leads can provide only a partial current path around its associated passive device. Stated another way, if desired, each bypass lead 148 can be connected to various points about the extent of its associated passive device wherein the bypass lead 148 only partially inactivates and activates the impedance provided by the passive device.

The bypass leads 148 result in the inductance of the impedance network 142 being about 2.5 nH. However, when a bypass lead 148 is severed, the impedance of the impedance network 142 is increased by the inductance of the inductor 146 associated with the severed bypass lead.

As explained in detail further herein, each bypass lead 148 can be severed by a laser, mechanically, chemically, or by other means, for adjusting the impedance of the impedance network 142. These adjustments to the impedance network 142 result, in kind, in a change in the output frequency of the voltage controlled oscillator 122, and thus the frequency translator 110.

Preferably, impedance network 142 is coupled to a resonator 140 that is a one-port surface-acoustic wave resonator. A suitable device includes, but is not necessarily limited to, a 622.28 MHZ SAW under the part number TC0172A by Tai-Saw Technology Co., Ltd.

In the preferred embodiment, the resonant frequency of the tank circuit with the resonator and associated inductors and capacitors is equal to approximately 622.08 MHZ for the phase-locked loop 112 to be phase locked to a multiple of the input frequency 116a. To assist in achieving the desired resonant frequency, the impedance network 142 is configured by severing the conductive leads 148 to provide an impedance that causes the desired resonant frequency to be produced. In particular, one or more conductive bypass leads 148 are severed until the desired frequency is provided by the oscillator circuit.

The specifications for selected circuit elements shown in FIG. 2 are presented below in TABLE I.

TABLE I

| Reference ID (from FIG. 2) | Specification |
|---|---|
| C1, C2, C3, C6, C14, C24 | 0.1 µF |
| C3, C7, C8, C25, C31 | 0.01 µF |
| C5, C9, C13 | 2.2 µF |
| C10 | 3.3 pF |
| C11, C18, C27 | Do Not Place |
| C12 | 22 µF |
| C15, C19, C23 | 100 pF |

TABLE I-continued

| Reference ID (from FIG. 2) | Specification |
| --- | --- |
| C16, C20, C21, C22 | 10 pF |
| C17 | 4.7 pF |
| R1, R2, R13 | Do Not Place |
| R2, R11 | 51 Ω |
| R4 | 100 Ω |
| R5 | 4.7 kΩ |
| R6 | 180 Ω |
| R7, R15 | 0 Ω |
| R8 | 150 Ω |
| R9 | 470 Ω |
| R10 | 2.7 kΩ |
| R12 | 1 kΩ |
| R14 | 16 Ω |
| L1, L2 | 68 nH |
| L3 | 39 nH |
| L4 | 15 nH |
| D1 | Infineon: BBY57-02W |
| Y1 | Tai-Saw: TC0172A |
| Q1 | NEC: UPA861TD |
| U2 | Peregrine: PE3341 |
| U1 | AZM: AZ100EL16VOL |
| U3 | Torex: XC6204B302MR |
|  | National Semi: LP2985AIM53.0 |

Figure 4:
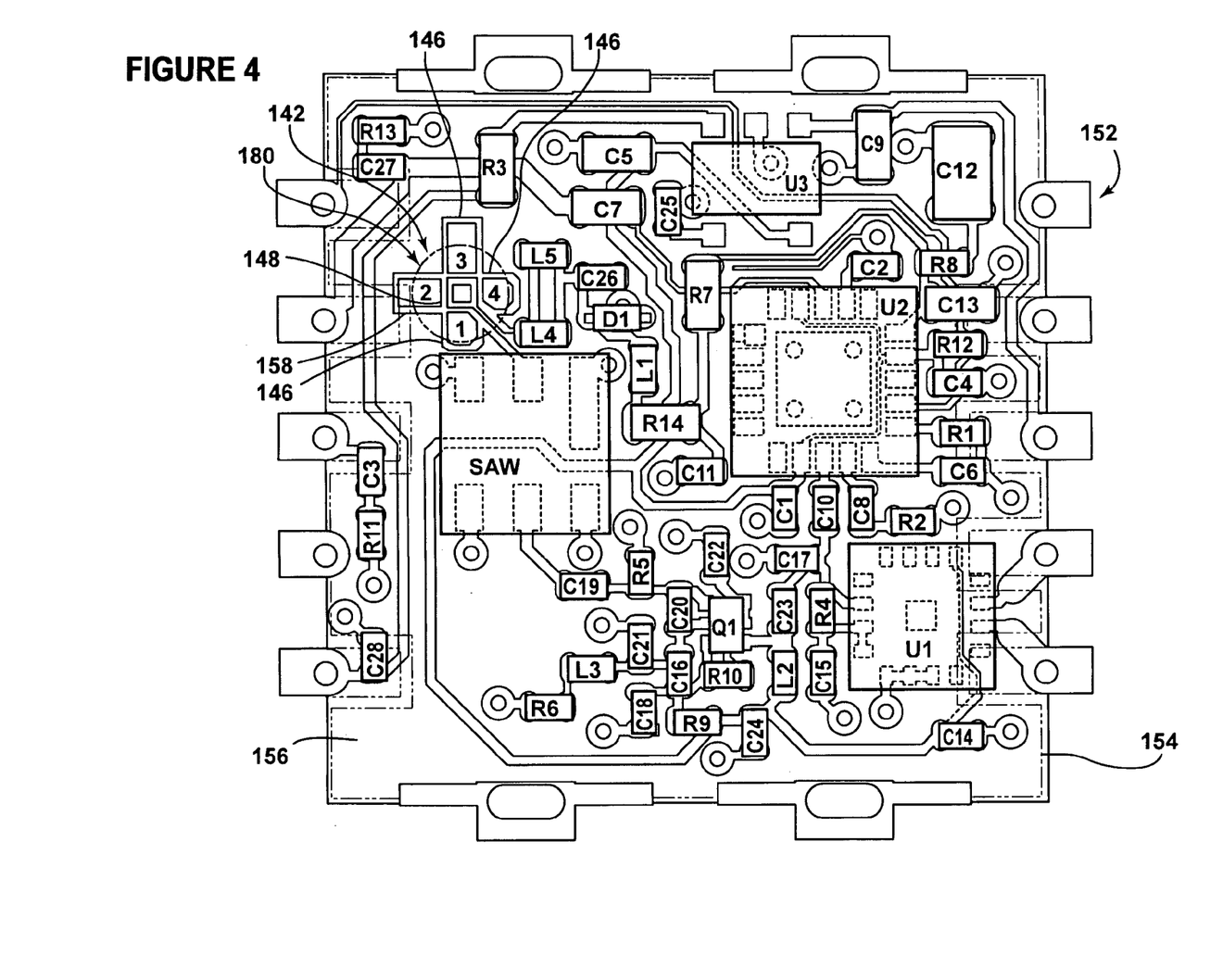
FIG. 4 is an enlarged top view of a circuit board layout for implementing the frequency translator shown in FIG. 2.

Turning to FIG. 4, an enlarged view of a printed circuit board layout is depicted that includes an electrically conductive pattern (i.e., electrically conductive printed wiring or traces). As shown, the circuit board layout also includes mounting sites for placement of the components of FIG. 2.

Preferably, the printed circuit board 152 includes a plurality of conventional electrically insulative boards 154 (only one board shown). At least one outer surface 156 of the circuit board 152 includes printed wiring or traces 158 configured as an impedance network 142. The printed wiring or traces are attached to the printed circuit board 152 in a convention manner and consist of a metal or metal alloy such as copper.

As shown in FIG. 4, the tuner or impedance network 142 includes a plurality of impedance devices comprising inductors 146 that are serially connected to each other and a bypass lead 148 extending across the terminal ends of each inductor, respectively. As depicted, each inductor 146 consists of a curvilinear portion of printed wiring that is generally U-shaped. The terminal ends of each inductor 146 are integrally connected to the ends of an associated bypass lead 148. The inductors 146 are serially connected together with the two ends of the impedance network 142 operably connected to other circuitry.

Figure 7:
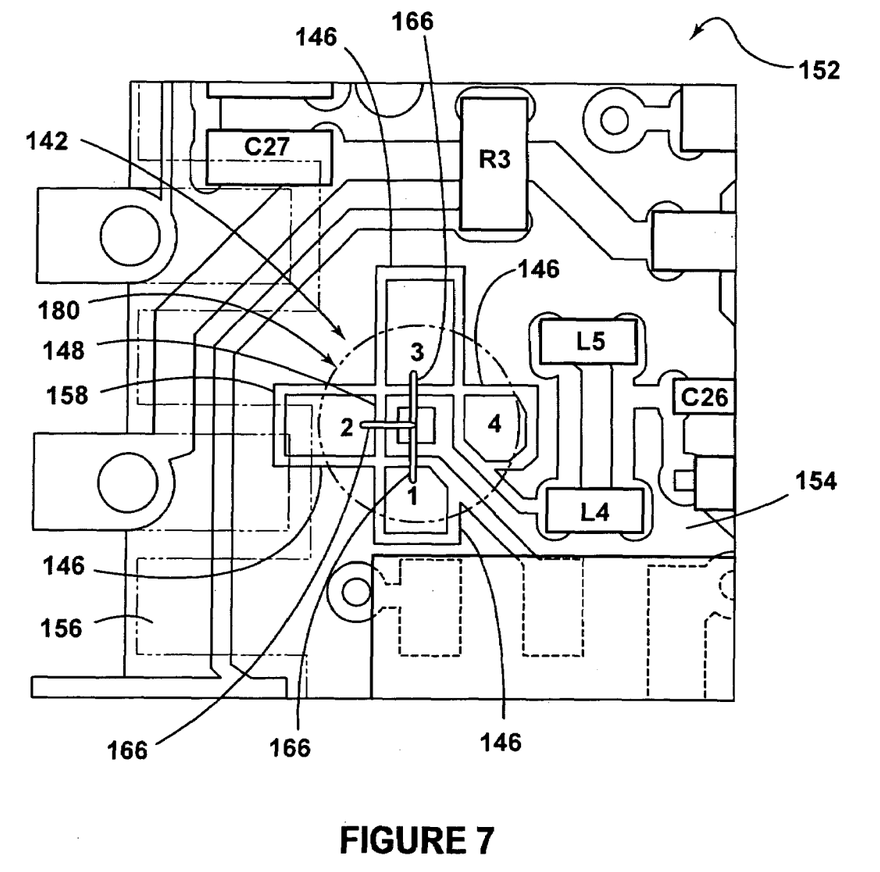
FIG. 7 is a further enlarged view depicting cuts made to a portion of the circuit board of FIG. 4.

As indicated previously, the impedance network 142 is fabricated on the printed circuit board 152 with all of the bypass leads 148 intact across each of the inductors 146, respectively. Accordingly, this results in the impedance network 142 having an initial low impedance which translates to an initial inductance of about 2.5 nH. However, when a bypass lead 148 is severed, the impedance of the impedance network 142 is increased by the inductance of the inductor 146 associated with the severed bypass lead. In the preferred embodiment, impedance network 142 takes the form of a network of printed inductors as shown in FIGS. 4 and 7.

After the components are mounted onto the circuit board 152, the operation of the frequency translator is observed. In particular, the resonant frequency of the SAW based oscillating circuit is observed. This testing is conducted in a conventional manner wherein the frequency translator is detachably mounted to a testing station and the electrical output parameters of the circuitry are then observed using conventional testing equipment.

If, during the testing, it is determined that the resonate frequency of the resonator is too high, then one or more of the bypass leads 148 within the impedance network 142 is cut or severed to increase the total inductance of the impedance network.

Accordingly, as the inductance of the impedance network 142 is increased, the resonant frequency of the surface-acoustic wave based tank circuit is lowered. Preferably, the components within the translator circuit, and in particular the voltage controlled oscillator circuit, are selected to provide an initial resonant frequency that is too high upon initial fabrication of the frequency translator. Thus, one or more bypass leads typically must be cut or severed to obtain the desired resonant frequency of the voltage controlled oscillator. To obtain a maximum yield, the component selection should be such that, typically, about half of the bypass leads are severed for obtaining the desired resonant frequency of the voltage controlled oscillator. The bypass leads can be severed by using a laser, mechanical, chemical, or other suitable means for terminating or degrading the flow of electrical current through the leads.

Because of the above described tuning feature, yields of about 100% can be achieved when using surface-acoustic resonators having a variance of about 30 kHz along with other manufacturing variables in the construction of the product. For example, if each inductor contained within the impedance network depicted in FIGS. 2 and 4 provides an increase in the resonant frequency, then the following algorithm is used to achieve the desired result:

| Output frequency | Leads Severed |
| --- | --- |
| 622.08 MHZ − 35 ppm | 0 |
| 622.08 MHZ − 5 ppm | 1 |
| 622.08 MHZ + 45 ppm | 2 |
| 622.08 MHZ + 105 ppm | 3 |
| 622.08 MHZ + 135 ppm | 4 |

Figure 5:
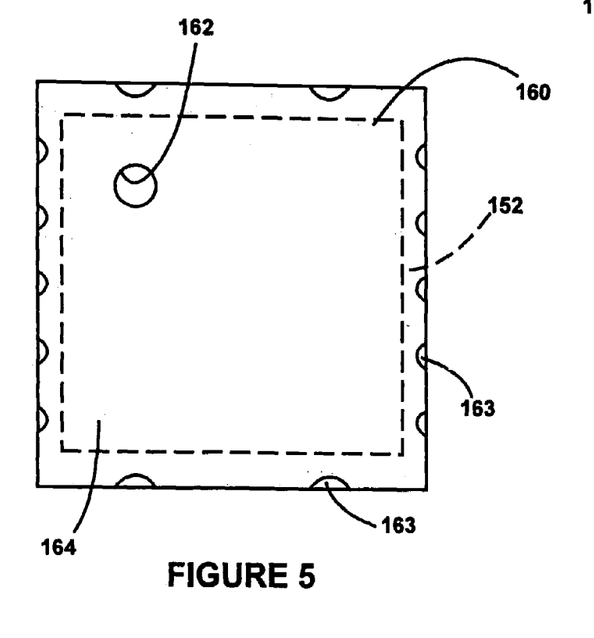
FIG. 5 is an enlarged top view of a package for containing the frequency translator circuit of FIG. 2 mounted to the circuit board of FIG. 4.
Figure 6:
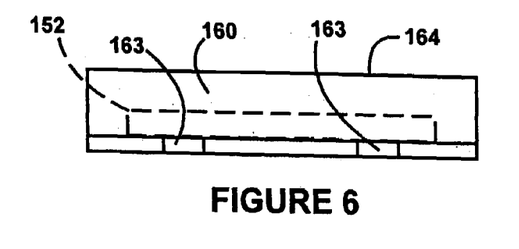
FIG. 6 is a side view of the package of FIG. 5.

In an embodiment, the frequency translator circuit, including the printed circuit board 152 can be contained within a suitable package such as a leadless carrier 160 (i.e., surface mount package) shown in FIGS. 5 and 6, or other packaging structure. The leadless carrier 160 is conventional in construction, but for a hole 162 in the lid 164. Accordingly, the leadless carrier 160 has a plurality of external connections 163 consisting of metallized terminations.

Preferably, the leadless carrier 160 has a metal or metal alloy lid 164 with the through-hole 162 extending through the lid. Contained within the leadless carrier 160 is the printed circuit board 152 with the through-hole 162 positioned over the impedance network 142 (FIG. 4).

Because of the position of the through-hole 162 over the impedance network 142 (FIG. 4), the through-hole provides an opening for focusing a laser beam into the package 160 and onto the bypass leads 148 of the impedance network 142 located on the outer surface 156 of the printed circuit board 152.

Using the through-hole 162, the translator circuit can be tuned by cutting the bypass leads 148 with the laser. For example, as shown in FIG. 7, three conductive bypass leads 148 are illustrated as being severed by laser cuts 166. Once the circuit has been tuned, the through-hole 162 within the lid 166 can be covered with a label or left open.

Alternatively, instead of tuning the frequency translator within the leadless chip carrier, the frequency translator circuit can be tuned before it is enclosed within the package. It is a key feature of the present invention that the translator can be tuned with a plurality of discrete adjustments through access to only a small part of the impedance network. In other words, an advantage of the present invention is that the access area to the circuit board needed to make the frequency adjustment is significantly smaller than the area to provide the overall tuning effect. For example, impedance network 142 occupies board space of about 0.0127 square inches, but the selection leads 148 can be accessed from a circular area of about 0.00656 square inches, which corresponds to access opening 162 (FIG. 5) and outline 180 in FIGS. 4 and 7. This arrangement allows a relatively small access opening in cover 164 to provide several discrete tuning adjustments. In the preferred translator embodiment, the four discrete adjustments can be made using about 50 percent (%) of the area occupied by the impedance network.

A convenient measure of this adjustment efficiency is a following ratio of the number of discreet impedance adjustments to the fraction of the impedance network area that must be available to make the adjustments. A preferred translator circuit provides an adjustment efficiency in the range of about 4 to about 20, and most preferable about 8.

Figure 9:
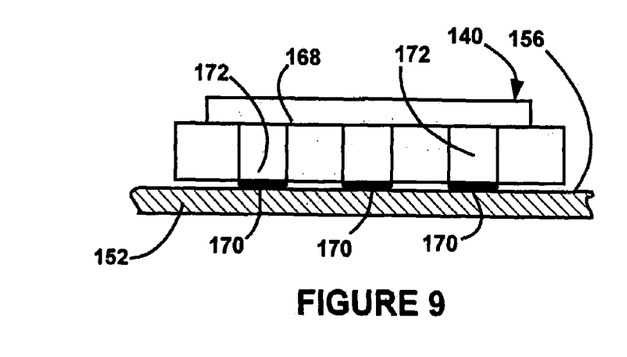
FIG. 9 is an enlarged side view of a package for containing the surface-acoustic wave resonator contained within the circuit diagram of FIG. 2; and, FIG. 10 is a graph of the phase jitter attenuation of a frequency translator fabricated according to the simplified circuit diagram of FIG. 2.

Turning to FIG. 9, the resonator 140 contained within the frequency translator is packaged in a conventional surface mount device such as a leadless carrier 168. Preferably, the leadless carrier 168 is attached to the printed circuit board 152 using a compliant material 170 between the terminals 172 located on the bottom of the carrier and a matching footprint on the printed circuit board 152. The compliant material 170 is filled with an electrically conductive metal or metal alloy. For instance, the metal can be silver, gold, nickel-silver, or another electrically conductive metal or metal alloy. Likewise, the filled compliant material 170 can be silicone or another type of flexible adhesive. In a preferred embodiment, the compliant material 170 between the resonator 140 and the circuit board 152 is silver-filled silicone.

The use of a compliant material, as opposed to solder, reduces the rigidity of the mechanical connection between the resonator carrier 168 and the printed circuit board 152. In particular, silicone has a lower Young's Modulus than solder. In contrast a tin based solder typically has a Young's Modulus of between about 58 GPa to about 35 GPa and a lead based solder has a Young's Modulus of between about 13.4 GPa to about 4.91 GPa. The preferred compliant material for the present invention has a Young's Modules of less than 1 GPa, and more preferably below 0.5 GPa.

Using a compliant material such as silver-filled silicone having a Young's Modulus that is less than solder results in an improvement in the microphonic performance of the frequency translator. It has been observed that, with a 4 G acceleration, the maximum frequency shift of the frequency translator goes from 1.8 KHz with the solder mount, to 20 Hz with the silicone.

Figure 10:
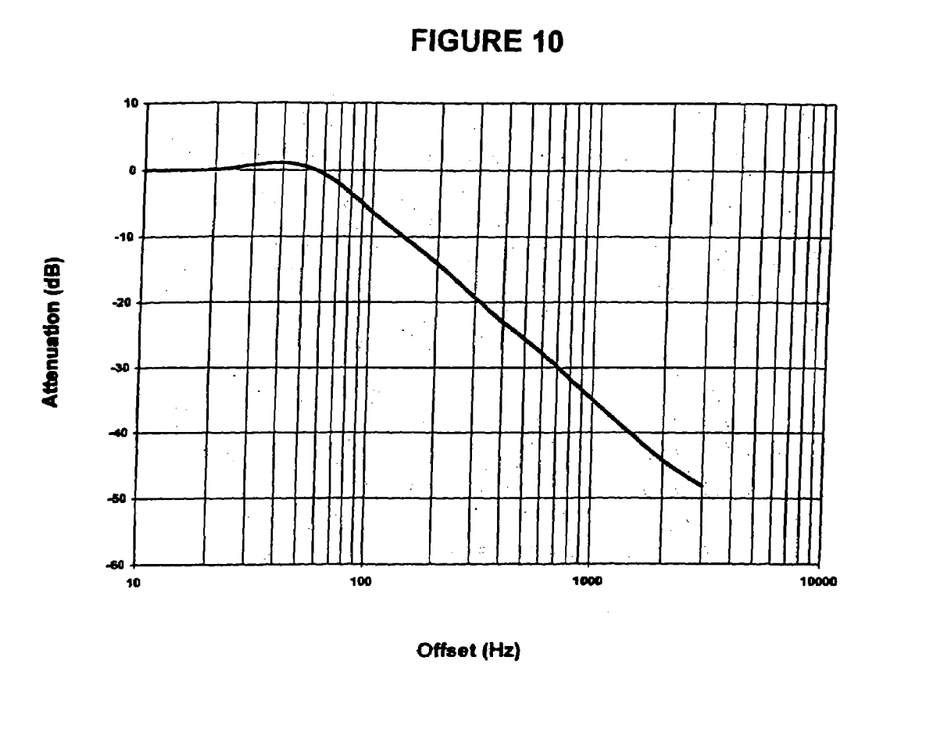

Turning to FIG. 10, a graph is provided of the phase jitter attenuation for a frequency translator fabricated according to the simplified circuit diagram of FIG. 2. As shown in the graph, the high "Q" of the surface-acoustic wave resonator and the low bandwidth loop filter result in good jitter attenuation performance of the circuitry.

As indicated previously, with prescalers on the input and/or output, and with corresponding programming of the phase-locked loop, various combinations of input and output frequencies can be realized in this family of surface mount frequency translators.

Numerous variations and modifications of the embodiments described above may be effected without departing from the spirit and scope of the novel features of the invention. No limitations with respect to the specific system illustrated herein are intended or should be inferred.

We claim:

1. A frequency translator comprising:
   a circuit board;
   a phase-locked loop circuit comprising a phase detector, a divider, and a voltage controlled oscillator;
   a resonator comprising a surface-acoustic wave device adapted to be mounted and secured to the circuit board;
   an impedance network operably coupled to the resonator, the network comprising a plurality of passive devices with and an electrically conductive lead associated with each of the passive devices;
   a package containing said circuit board and said phase-locked loop circuit; and,
   said one or more of said conductive leads, being severable to define one or more severed conductive leads whereby the impedance of the impedance network is increased by the inductance of the one or more passive devices associated with the one or more severed conductive leads respectively.

2. The frequency translator of claim 1, said package containing a nonvolatile memory.

3. The frequency translator of claim 2, said nonvolatile memory containing control data to configure a prescaler within the phase-locked loop.

4. The frequency translator of claim 1 wherein said conductive lead is a portion of printed wiring on the circuit board.

5. The frequency translator of claim 1 wherein said impedance network is fabricated from a portion of printed wiring on the circuit board.

6. The frequency translator of claim 1, wherein each of said passive devices comprises at least one inductive segment of printed wiring.

7. The frequency translator of claim 1, said impedance network comprising at least two passive devices.

8. The frequency translator of claim 1, said impedance network comprising five passive devices.

9. The frequency translator of claim 1, said impedance network comprising at least two passive devices serially connected together, each of the passive devices defining terminal ends and the conductive lead associated therewith extending between and connected to the terminal ends.

10. The frequency translator of claim 1 wherein each of said passive devices is a curvilinear portion of printed wiring on the circuit board terminating into opposed ends, the conductive lead associated therewith extending between and connected to the opposed ends thereof.

11. The frequency translator of claim 1 wherein each of said passive devices is an inductor.

12. The frequency translator of claim 1 wherein each of said passive devices is a capacitor.

13. The frequency translator of claim 1 wherein each of said passive devices is a resistor.

14. The frequency translator of claim 1 wherein said package defines a through-hole positioned above said electrically conductive lead for focusing a laser beam into the through-hole and onto the conductive lead for severing the same.

15. The frequency translator of claim 1 wherein said phase-locked loop circuit generates about a 622.08 MHZ output in response to about a 155.52 MHZ input.

16. A frequency translator comprising:
a circuit board composed of a first material having frequency translator circuitry mounted thereto and comprising a phase-locked loop having a resonator; and
a compliant material positioned between the circuit board and the resonator and having a Young's Modulus which is lower than the Young's Modulus of the first material of said circuit board.

17. The frequency translator of claim 16, said compliant material comprising silicone.

18. The frequency translator of claim 16, said compliant material comprising a metal or metal alloy filling.

19. The frequency translator of claim 16, said compliant material comprising a silver-filled silicone.

20. The frequency translator of claim 16, said compliant material having a Young's Modulus of less than 1 GPa.

21. The frequency translator of claim 16, said compliant material having a Young's Modules of less than 0.5 GPa.

22. The frequency translator of claim 16, said frequency translator circuitry further comprising a nonvolatile memory.

23. The frequency translator of claim 22 wherein said nonvolatile memory contains control data to configure a prescaler within the phase-locked loop.

24. The frequency translator of claim 16 wherein said frequency translator circuitry generates about a 622.08 MHZ output in response to about a 155.52 MHZ input.

25. The frequency translator of claim 16 wherein said resonator is a surface-acoustic wave device packaged in a carrier adapted to be attached to the printed circuit board over the compliant material.

26. The frequency translator of claim 16 wherein said circuit board is contained within a carrier.

27. A method of fabricating a frequency translator circuit on a circuit board having a resonator device adapted for coupling to the circuit board and coupled to a separate impedance network including a plurality of passive devices and an electrically conductive lead associated with each of said passive devices, the method comprising the steps of:
securing the resonator to the circuit board using a compliant material positioned between the resonator and the circuit board, the compliant material having a Young's Modulus which is less that the Young's Modulus of the material of the circuit board;
providing a reference frequency to the frequency translator circuit;
observing an output frequency generated by the frequency translator circuit;
short-circuiting at least a portion of one or more of the plurality of passive devices by serving the respective electrically conductive leads associated therewith; and
observing the output frequency generated by the frequency translator circuit after the one or more of said conductive leads have been severed.

28. The method of claim 27, said compliant material comprising silicone.

29. The method of claim 27, said compliant material comprising a metal or metal alloy filling.

30. The method of claim 27, said compliant material comprising a silver-filled silicone.

31. The method of claim 27, said compliant material having a Young's Modulus of less than 1 GPa.

32. The method of claim 27, said complaint material having a Young's Modules of less than 0.5 GPa.

33. The method of claim 27, wherein each of the conductive leads is defined by a strip of wiring on the circuit board, the conductive leads being connected together to define a continuous strip of wiring on the circuit board with at least a portion thereof being in the shape of a loop, each of the passive devices being defined by a curved segment of wiring terminating into opposed terminal ends and having a conductive lead extending and connected therebetween.

34. The method of claim 33, wherein the passive devices extend around the loop defined by a portion of said conductive leads in a spaced-apart relationship.

* * * * *